(12) United States Patent
Zhou et al.

(10) Patent No.: US 12,133,367 B2
(45) Date of Patent: Oct. 29, 2024

(54) PCB HEAT DISSIPATION ASSEMBLY AND SERVER HAVING SAME

(71) Applicant: BITMAIN TECHNOLOGIES INC., Beijing (CN)

(72) Inventors: Xuesong Zhou, Beijing (CN); Jianjun Pan, Beijing (CN); Shizhen Liao, Beijing (CN); Shuhao Zhang, Beijing (CN); Xudong Wang, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 121 days.

(21) Appl. No.: 17/636,644

(22) PCT Filed: Oct. 31, 2019

(86) PCT No.: PCT/CN2019/114832
§ 371 (c)(1),
(2) Date: Feb. 18, 2022

(87) PCT Pub. No.: WO2021/081927
PCT Pub. Date: May 6, 2021

(65) Prior Publication Data
US 2022/0272872 A1   Aug. 25, 2022

(51) Int. Cl.
*H05K 7/20* (2006.01)
*H05K 1/02* (2006.01)

(52) U.S. Cl.
CPC ....... *H05K 7/20727* (2013.01); *H05K 1/0272* (2013.01)

(58) Field of Classification Search
None
See application file for complete search history.

(56) References Cited

U.S. PATENT DOCUMENTS 7,120,018 B2 * 10/2006 Shen ..................... G06F 1/20
174/16.3
7,760,498 B2 * 7/2010 Shan .................. H05K 7/20563
361/695

(Continued)

FOREIGN PATENT DOCUMENTS

CN    2904598 Y    5/2007
CN    201750358 U    2/2011

(Continued)

OTHER PUBLICATIONS

International Search Report and Written Opinion mailed Jul. 30, 2020 in corresponding International Application No. PCT/CN2019/114832.

*Primary Examiner* — Courtney L Smith
(74) *Attorney, Agent, or Firm* — Jon E. Gordon; Haug Partners LLP (57) ABSTRACT

Disclosed are a PCB heat dissipation assembly (100) and a server having same. The PCB heat dissipation assembly (100) includes: a PCB board (1), a plurality of chips (11) being arranged on the PCB board (1); at least one heat sink (2), the heat sink (2) being arranged on the plurality of chips (11), and the heat sink (2) including a heat dissipation air duct (21); and an air baffle (3), the air baffle (3) being arranged adjacent to the at least one heat sink (2), the air baffle (3) being located on one side of the at least one heat sink (2), and the air baffle (3) extending along the heat dissipation air duct (21).

12 Claims, 4 Drawing Sheets

(56) References Cited

U.S. PATENT DOCUMENTS

| | | | |
|---|---|---|---|
| 8,776,833 B2 | 7/2014 | Zhang et al. | |
| 10,602,639 B2 * | 3/2020 | Chang | G06F 1/20 |
| 2006/0082967 A1 * | 4/2006 | Deguchi | H05K 7/20145 |
| | | | 312/236 |
| 2007/0235168 A1 * | 10/2007 | Chen | H05K 7/20727 |
| | | | 257/E23.099 |
| 2008/0041562 A1 * | 2/2008 | Bhatia | H05K 7/20154 |
| | | | 257/E23.099 |
| 2014/0177167 A1 * | 6/2014 | Tang | H01L 23/467 |
| | | | 361/679.54 |
| 2014/0177168 A1 * | 6/2014 | Scott | H05K 7/20727 |
| | | | 361/679.54 |
| 2021/0051818 A1 * | 2/2021 | Cao | H05K 7/20518 |
| 2023/0070604 A1 * | 3/2023 | Chen | H05K 7/20154 |

FOREIGN PATENT DOCUMENTS

| | | |
|---|---|---|
| CN | 102573398 A | 7/2012 |
| CN | 103165548 A | 6/2013 |
| CN | 103901977 A | 7/2014 |
| CN | 208848155 U | 5/2019 |
| CN | 110134207 A | 8/2019 |

\* cited by examiner

PCB HEAT DISSIPATION ASSEMBLY AND SERVER HAVING SAME

CROSS-REFERENCE TO RELATED APPLICATIONS

This application is the National Stage entry under 35 U.S.C. § 371 of International Application No. PCT/CN2019/114832, filed on Oct. 31, 2019, published on May 6, 2021 under Publication Number WO 2021/081927 A1, the entirety of which is herein incorporated by reference.

TECHNICAL FIELD

The present disclosure relates to the field of heat dissipation technologies, and in particular, to a PCB heat dissipation assembly and a server having same.

BACKGROUND ART

A plurality of electronic components connected to a PCB (Printed Circuit Board, which is an important electronic part, a support for electronic components, and a carrier for electrical connections of the electronic components) board may generate heat during operation, and to discharge the heat in a timely manner, a heat sink is usually provided on the PCB board for heat dissipation.

In the related art, air sent out by a fan tends to be discharged from a gap between a heat sink fin and a case, resulting in a reduced heat dissipation efficiency.

SUMMARY OF THE INVENTION

The present disclosure is intended to solve at least one of the technical problems existing in the prior art. To this end, an object of the present disclosure is to provide a PCB heat dissipation assembly, which has a relatively high heat dissipation efficiency.

Another object of the present disclosure is to provide a server having the foregoing PCB heat dissipation assembly.

A PCB heat dissipation assembly according to an embodiment in a first aspect of the present disclosure includes: a PCB board, a plurality of chips being arranged on the PCB board; at least one heat sink, the heat sink being arranged on the plurality of chips, and the heat sink including a heat dissipation air duct; and an air baffle, the air baffle being arranged adjacent to the at least one heat sink, the air baffle being located on one side of the at least one heat sink, and the air baffle extending along the heat dissipation air duct.

According to the PCB heat dissipation assembly in this embodiment of the present disclosure, the air baffle is arranged on the side adjacent to the heat sink and extends along the heat dissipation air duct of the heat sink, and the air baffle stops air such that the air can flow through the heat sink and adequately dissipate the heat generated by the chips, thereby effectively improving the heat dissipation efficiency of the PCB heat dissipation assembly. In addition, the air baffle thus arranged is structurally simple, occupies a small space, and has lower costs.

According to some examples of the present disclosure, one end of the air baffle is provided with an air guide plate.

According to some examples of the present disclosure, a distance between the air guide plate and the heat sink gradually increases in a direction away from the air baffle.

According to some examples of the present disclosure, the air baffle and the air guide plate are both in a welded connection to the PCB board.

According to some examples of the present disclosure, the bottom of the air baffle is provided with a first bent edge, the bottom of the air guide plate is provided with a second bent edge, the air baffle is in a welded connection to the PCB board by means of the first bent edge, the air guide plate is in a welded connection to the PCB board by means of the second bent edge, and the first bent edge and the second bent edge are spaced apart.

According to some examples of the present disclosure, the air baffle is in a threaded connection to the PCB board.

According to some examples of the present disclosure, at least one mounting bracket and at least one mounting bar are fastened onto the PCB board, the at least one mounting bracket and the at least one mounting bar are spaced apart in a lengthwise direction of the air baffle, the air baffle is in a threaded connection to the mounting bracket, the at least one mounting bar is opposite the bottom of the air baffle, and the at least one mounting bar is arranged between and presses against the air baffle and the PCB board.

According to some examples of the present disclosure, the mounting bracket is provided with a connecting plate extending upward, a first nut is arranged on a side of the connecting plate that is away from the air baffle, and a first screw passes through the air baffle for a threaded connection to the first nut, to fasten the air baffle onto the mounting bracket.

According to some examples of the present disclosure, the air baffle is formed with a positioning hole, and the connecting plate is provided with a positioning portion fitted in the positioning hole.

According to some examples of the present disclosure, a spacer plate is arranged on a side of the air baffle that is away from the connecting plate, and the first screw passes through the spacer plate and the air baffle for a threaded connection to the first nut.

According to some examples of the present disclosure, the mounting bracket is provided with a horizontally extending support plate; and the air baffle is provided with at least one mating plate, the mating plate is arranged on an upper surface of the support plate, and a second screw passes through the mating plate for a threaded connection to the support plate, to fasten the air baffle onto the mounting bracket.

According to some examples of the present disclosure, the mounting bracket is provided with an extension plate extending upward, the support plate is connected at the top of the extension plate, a second nut is arranged on a lower surface of the support plate, and the second screw passes through the mating plate and the support plate for a threaded connection to the second nut.

According to some examples of the present disclosure, the extension plate includes an extension plate body and a limiting plate; and the air baffle is provided with a notch, the support plate is fitted at the notch, and edges of the notch is fitted between the extension plate body and the limiting plate.

A server according to an embodiment in a second aspect of the present disclosure includes a PCB heat dissipation assembly according to the embodiment in the first aspect of the present disclosure.

Additional aspects and advantages of the present disclosure will be set forth in part in the following description, and in part will be apparent from the following description, or may be learned by practice of the present disclosure.

BRIEF DESCRIPTION OF THE DRAWINGS

The foregoing and/or additional aspects and advantages of the present disclosure will become apparent and readily understood from the description of embodiments in conjunction with the following accompanying drawings, in which.

REFERENCE NUMERALS

100: PCB heat dissipation assembly;
1: PCB board; 11: Chip; 12: Mounting bracket;
121: Mounting bar; 122: Connecting plate; A: Flow direction of heat dissipation airflow
1221: First nut; 1222: Positioning portion;
123: Support plate; 1231: Second nut; 124: Extension plate;
1241: Extension plate body; 1242: Limiting plate;
2: Heat sink; 21: Heat dissipation air duct; 3: Air baffle; 31: First bent edge;
32: Positioning hole; 33: Spacer plate; 34: Mating plate; 35: Notch;
4: Air guide plate; 41: Second bent edge; 5: First screw; and 6: Second screw.

DETAILED DESCRIPTION OF EMBODIMENTS

Embodiments of the present disclosure will be described in detail below. Examples of the embodiments are shown in the accompanying drawings, and throughout the accompanying drawings, the same or similar reference numerals refer to the same or similar elements or elements having the same or similar functions. The embodiments described below with reference to the accompanying drawings are exemplary and are merely intended to explain the present disclosure, and should not be construed as limiting the present disclosure.

In the description of the present disclosure, it should be understood that orientation or position relationships indicated by terms such as "center", "up", "down", "front", "rear", "left", "right", "vertical", "horizontal", "top", "bottom", "inside", and "outside" are based on orientation or position relationships shown in the accompanying drawings and are merely for ease of description of the present disclosure and simplification of the description, rather than indicating or implying that the apparatuses or elements referred to must have a specific orientation or be constructed and operated in a specific orientation, and therefore cannot be construed as limiting the present disclosure.

It should be noted that the terms "first" and "second" are merely for the purpose of illustration, and should not be construed as indicating or implying the relative importance or implicitly indicating the number of technical features indicated. Thus, the features defined with "first" and "second" may explicitly or implicitly include one or more features. Further, in the description of the present disclosure, "a plurality of" means two or more, unless otherwise specified.

A PCB heat dissipation assembly 100 according to an embodiment in a first aspect of the present disclosure is described below with reference to FIG. 1 to FIG. 7. The PCB heat dissipation assembly 100 may be applied to a server (not shown in the figure). In the following description of the present application, the PCB heat dissipation assembly 100 being applied to a server is taken as an example for description.

Figure 1:
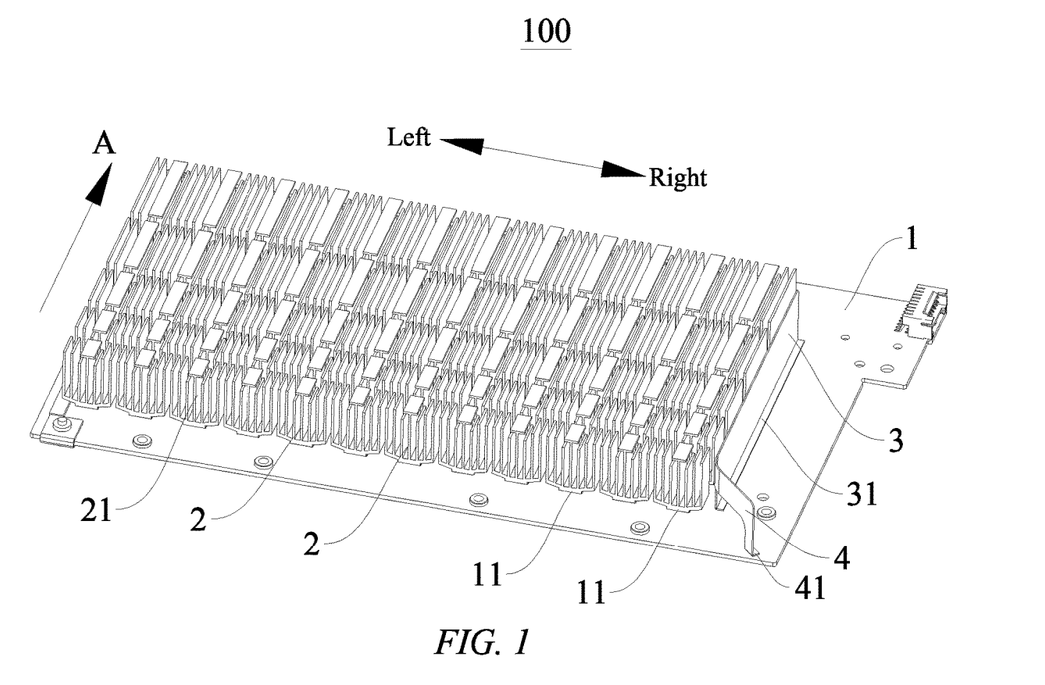
FIG. 1 is a perspective view of a PCB heat dissipation assembly according to an embodiment of the present disclosure.
Figure 3:
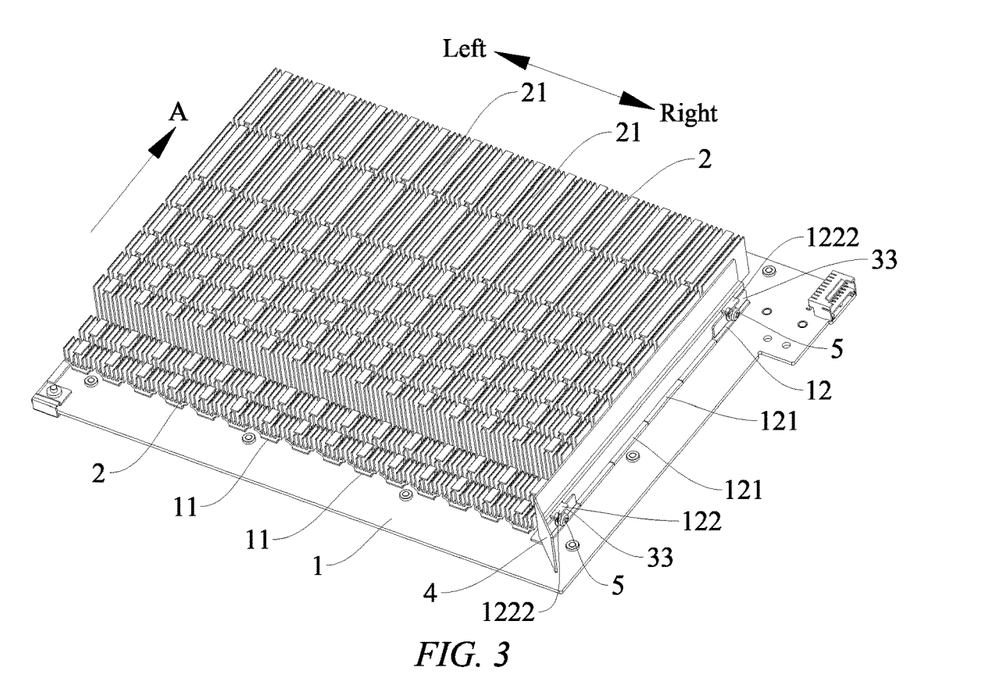
FIG. 3 is a perspective view of a PCB heat dissipation assembly according to another embodiment of the present disclosure.
Figure 5:
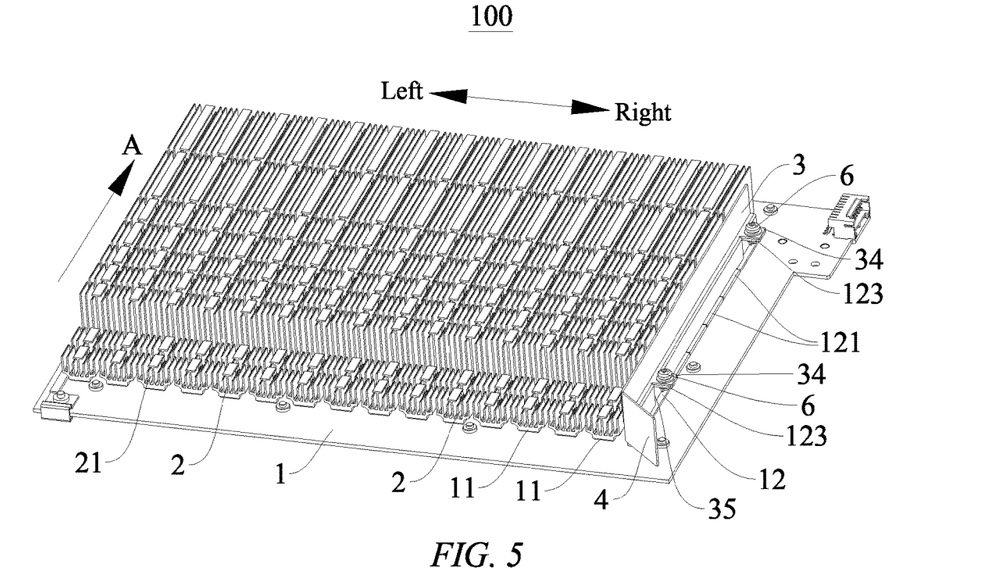
FIG. 5 is a perspective view of a PCB heat dissipation assembly according to still another embodiment of the present disclosure.

As shown in FIG. 1, FIG. 3, and FIG. 5, the PCB heat dissipation assembly 100 according to the embodiment in the first aspect of the present disclosure includes a PCB board 1, at least one heat sink 2, and an air baffle 3.

Specifically, a plurality of chips 11 are arranged on the PCB board 1, the heat sink 2 is arranged on the plurality of chips 11, and the heat sink 2 includes a heat dissipation air duct 21. The air baffle 3 is arranged adjacent to the at least one heat sink 2, the air baffle 3 is located on one side of the at least one heat sink 2, and the air baffle 3 extends along the heat dissipation air duct 21. For example, in examples of FIG. 1, FIG. 3, and FIG. 5, the plurality of chips 11 are arranged on the PCB board 1, and a plurality of heat sinks 2 each including a heat dissipation air duct 21 are arranged on the plurality of chips 11, so that heat generated by the chips 11 can be directly and adequately conducted to the heat sinks 2. The air baffle 3 is located on the right side of the plurality of heat sinks 2, and an extension direction of the air baffle 3 is the same as an extension direction of the heat dissipation air duct 21. When a fan (not shown in the figure) located on a side of the PCB board 1 is operating, the air baffle 3 can stop air sent out by the fan, to prevent the air from flowing out along a gap between the heat sink 2 and a case wall of the server, such that the air can be sent out by the heat sinks 2 located above the chips 11, thereby dissipating the heat from the heat sinks 2 and discharging the heat out of the server. Therefore, when the PCB heat dissipation assembly 100 is applied to the server, providing the air baffle 3 can improve an internal air duct of the server and reduce the loss of heat dissipation air, so that more air can flow through the heat sink 2 and take away the heat generated by the chips 11, thereby effectively improving the heat dissipation efficiency of the PCB heat dissipation assembly 100. In addition, the air baffle 3 thus arranged is structurally simple, occupies a small space, and has lower costs.

According to the PCB heat dissipation assembly 100 in this embodiment of the present disclosure, the air baffle 3 is arranged on the side adjacent to the heat sink 2 and the air baffle 3 extends along the heat dissipation air duct 21 of the heat sink 2, and the air baffle 3 stops air such that the air can flow through the heat sink 2 and adequately dissipate the heat generated by the chips 11, thereby effectively improving the heat dissipation efficiency of the PCB heat dissipation assembly 100. In addition, the air baffle 3 thus arranged is structurally simple, occupies a small space, and has lower costs.

In some embodiments of the present disclosure, with reference to FIG. 1 to FIG. 6, one end of the air baffle 3 is provided with an air guide plate 4. A flow direction of heat dissipation airflow is shown by the arrow in FIG. 1, FIG. 3, and FIG. 5. In this way, the air guide plate 4 thus arranged can play a good role in guiding air, such that the air can adequately flow through the heat sink 2 and discharge the heat from the heat sink 2 out of the server case, thereby further improving the heat dissipation efficiency of the PCB heat dissipation assembly 100. The air baffle 3 and the air guide plate 4 may be metal pieces or non-metal pieces.

Further, as shown in FIG. 1 to FIG. 6, a distance between the air guide plate 4 and the heat sink 2 gradually increases in a direction away from the air baffle 3. With such an arrangement, the air can adequately flow to the heat sink 2 along the air guide plate 4, so that the heat dissipation efficiency of the PCB heat dissipation assembly 100 can be further improved, and the machining of the air guide plate 4 can thus be facilitated.

Optionally, the air baffle 3 and the air guide plate 4 are both in a welded connection to the PCB board 1. In this way, a firm connection between the air baffle 3 and the PCB board 1 and between the air guide plate 4 and the PCB board 1 can be implemented, and the production cost of the PCB heat dissipation assembly 100 can be reduced.

Further optionally, the air baffle 3 and the air guide plate 4 can be welded to the PCB board 1 by means of a through-hole technology or an SMT (an acronym for surface mount technology, which is an assembly technology that allows surface mounted components to be attached and welded onto a specified position on the surface of a printed circuit board, without the need to drill a mounting hole in the printed circuit board), etc.

Figure 2:
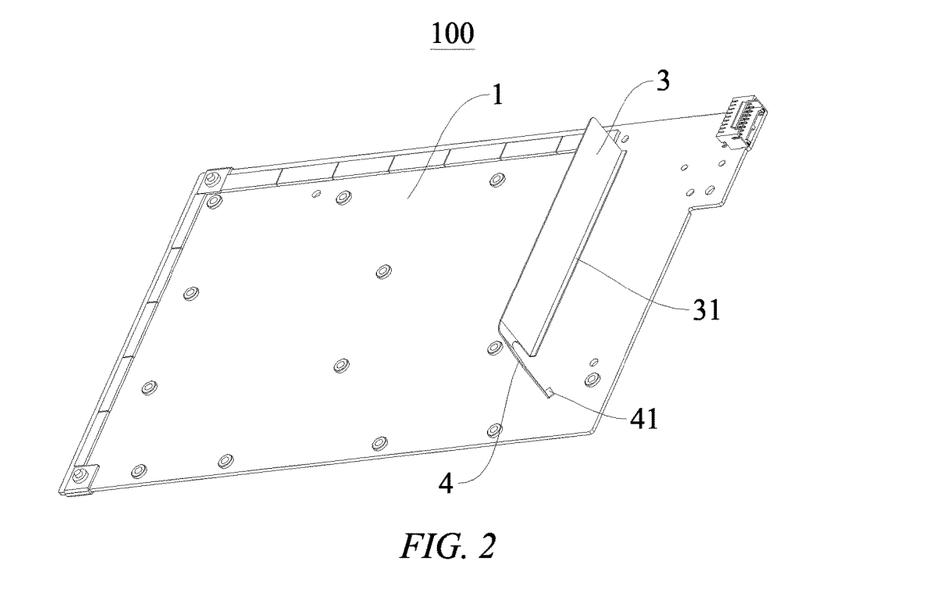
FIG. 2 is a perspective view of the PCB heat dissipation assembly shown in FIG. 1 from another perspective, in which no heat sink is shown.

Further, with reference to FIG. 1 and FIG. 2, the bottom of the air baffle 3 is provided with a first bent edge 31, the bottom of the air guide plate 4 is provided with a second bent edge 41, the air baffle 3 is in a welded connection to the PCB board 1 by means of the first bent edge 31, the air guide plate 4 is in a welded connection to the PCB board 1 by means of the second bent edge 41, and the first bent edge 31 and the second bent edge 41 are spaced apart. Therefore, providing the first bent edge 31 and the second bent edge 41 allows the connection between the air baffle 3 and the PCB board 1 and between the air guide plate 4 and the PCB board 1 to be firmer; and spacing apart the first bent edge 31 and the second bent edge 41 can effectively avoid stress concentration, thereby further ensuring the firmness of welding between the first bent edge 31 and the PCB board 1 and between the second bent edge 41 and the PCB board 1.

In some other embodiments of the present disclosure, with reference to FIG. 3 to FIG. 6, the air baffle 3 is in a threaded connection to the PCB board 1. In this way, a firm connection between the air baffle 3 and the PCB board 1 and between the air guide plate 4 and the PCB board 1 can also be implemented, and it allows for easy assembly/disassembly and replacement.

Further, as shown in FIG. 3 to FIG. 6, at least one mounting bracket 12 and at least one mounting bar 121 are fastened onto the PCB board 1, the at least one mounting bracket 12 and the at least one mounting bar 121 are spaced apart in a lengthwise direction of the air baffle 3, the air baffle 3 is in a threaded connection to the mounting bracket 12, the at least one mounting bar 121 is opposite the bottom of the air baffle 3, and the at least one mounting bar 121 is arranged between and presses against the air baffle 3 and the PCB board 1.

Figure 4:
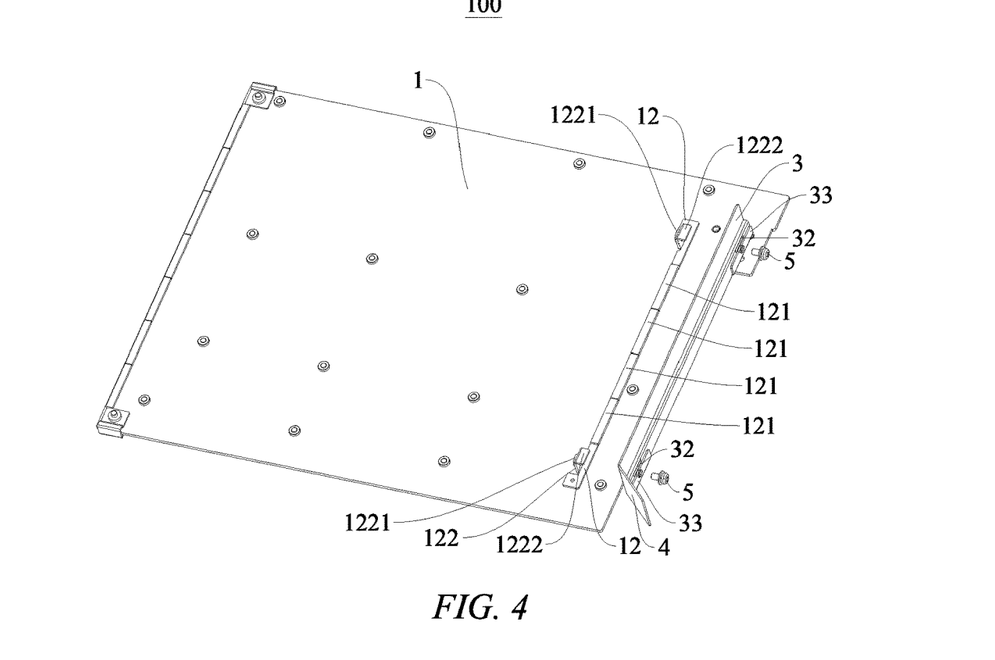
FIG. 4 is an exploded view of the PCB heat dissipation assembly shown in FIG. 1, in which no heat sink is shown.

For example, in examples of FIG. 3 and FIG. 4, there are two mounting brackets 12 and four mounting bars 121 fastened (e.g., by means of SMT welding) onto the PCB board 1. The two mounting brackets 12 and the four mounting bars 121 are both spaced apart in the lengthwise direction of the air baffle 3. The mounting bars 121 spaced apart can prevent warping and deformation due to an excessive length of the mounting bars 121, so that the mounting bars 121 can be more firmly connected to the PCB board 1. The air baffle 3 is in a threaded connection to the mounting bracket 12, and the four mounting bars 121 are all arranged in a gap between the air baffle 3 and the PCB board 1. With such an arrangement, the air baffle 3 that is uneven at the bottom can be fastened onto the PCB board 1 by means of the mounting bracket 12. Moreover, the at least one mounting bar 121 is provided, and the at least one mounting bar 121 can be arranged between and press against the air baffle 3 and the PCB board 1, preventing the heat dissipation air from being lost from the gap between the air baffle 3 and the PCB board 1, thereby further improving the heat dissipation efficiency of the PCB heat dissipation assembly 100.

In FIG. 3 and FIG. 4, two mounting brackets 12 and four mounting bars 121 are shown for the purpose of exemplary illustration. However, upon reading the technical solution of the present application, those of ordinary skill can obviously understand that applications of the solution in technical solutions in which there are other numbers of mounting brackets 12 and mounting bars 121 also fall within the scope of protection of the present disclosure.

Optionally, as shown in FIG. 3 to FIG. 6, a thickness of the bottom of the mounting bracket 12 may be less than a thickness of the mounting bar 121. For example, in examples of FIG. 5 to FIG. 7, two mounting brackets 12 and five mounting bars 121 are shown. The bottom of the mounting bracket 12 is substantially L-shaped, and a thickness of the bottom of each of the two mounting brackets 12 is less than a thickness of each of the mounting bars 121. Correspondingly, a part of the air baffle 3 that is opposite the mounting bracket 12 protrudes from a part thereof opposite the mounting bar 121, such that the bottom of the air baffle 3 can be in contact with the mounting bracket 12 and the mounting bar 121, to prevent the heat dissipation air from being lost from a gap between the air baffle 3 and the mounting bracket 12 or between the air baffle 3 and the mounting bar 121. Definitely, the thickness of the bottom of each of the mounting brackets 12 may also be greater than or equal to the thickness of each of the mounting bars 121, provided that the bottom of the air baffle 3 can be in full contact with the mounting bar 121 and the mounting bracket 12.

In some specific embodiments of the present disclosure, with reference to FIG. 3 and FIG. 4, the mounting bracket 12 is provided with a connecting plate 122 extending upward, a first nut 1221 is arranged on a side of the connecting plate 122 that is away from the air baffle 3, and a first screw 5 passes through the air baffle 3 for a threaded connection to the first nut 1221, to fasten the air baffle 3 onto the mounting bracket 12. For example, in the examples of FIG. 3 and FIG. 4, the mounting bracket 12 is provided with the connecting plate 122, and the connecting plate 122 extends upward vertically. The first nut 1221 is arranged on the left side of the connecting plate 122, and a central axis of the first nut 1221 extends horizontally. During mounting, the first screw 5 passes through the air baffle 3 from right to left for a threaded connection to the first nut 1221, thereby fastening the air baffle 3 onto the mounting bracket 12. During disassembly of the air baffle 3, only the first screw 5 needs to be removed from the first nut 1221. Therefore, providing the first nut 1221 ensures the structural strength of the connecting plate 122, and makes the entire PCB heat dissipation assembly 100 structurally simple, which facilitates the assembly/disassembly of the air baffle 3.

Optionally, with reference to FIG. 3 and FIG. 4, the air baffle 3 is formed with a positioning hole 32, and the connecting plate 122 is provided with a positioning portion

1222 fitted in the positioning hole 32. For example, in the examples of FIG. 3 and FIG. 4, the mounting bracket 12 is provided with the connecting plate 122 extending upward, and the positioning portion 1222 is connected at the top of the connecting plate 122 and extends toward the air baffle 3. During mounting, the positioning portion 1222 reaches into the positioning hole 32 of the air baffle 3, and then the first screw 5 passes through the air baffle 3 and the connecting plate 122 for a threaded connection to the first nut 1221, thereby fastening the air baffle 3 onto the mounting bracket 12. Therefore, providing the positioning portion 1222 can allow for the air baffle 3 to be more stably fastened onto the mounting bracket 12, which helps improve the heat dissipation efficiency of the PCB heat dissipation assembly 100, and can improve the structural stability of the entire PCB heat dissipation assembly 100.

Optionally, as shown in FIG. 3 and FIG. 4, a spacer plate 33 is arranged on a side of the air baffle 3 that is away from the connecting plate 122, and the first screw 5 passes through the spacer plate 33 and the air baffle 3 for a threaded connection to the first nut 1221. Therefore, arranging the spacer plate 33 can increase an area of contact between the first screw 5 and the air baffle 3 and prevent the air baffle 3 from shaking, so that the air baffle 3 can be more firmly fastened onto the mounting bracket 12.

Figure 6:
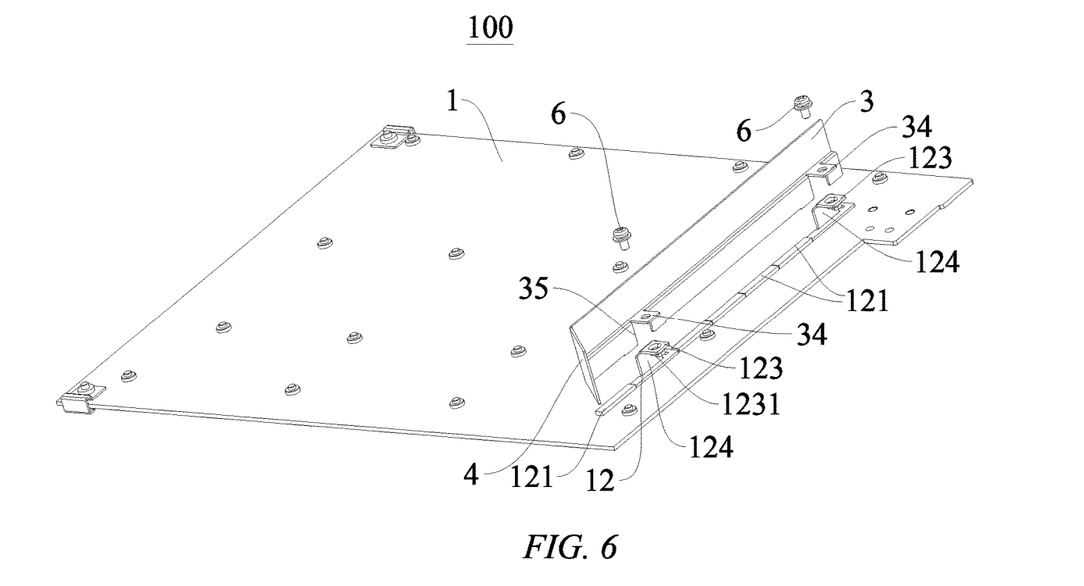
FIG. 6 is an exploded view of the PCB heat dissipation assembly shown in FIG. 5, in which no heat sink is shown.
Figure 7:
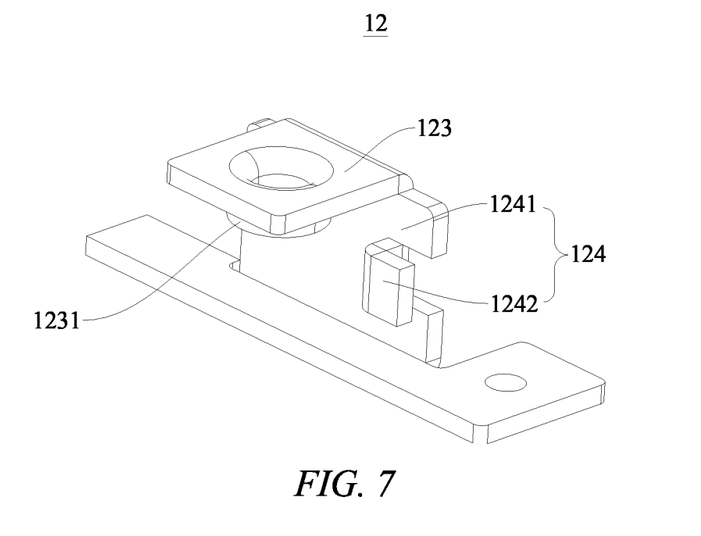
FIG. 7 is a perspective view of a support plate and an extension plate of the PCB heat dissipation assembly shown in FIG. 6.

According to some other embodiments of the present disclosure, with reference to FIG. 5 to FIG. 7, the mounting bracket 12 is provided with a horizontally extending support plate 123; and the air baffle 3 is provided with at least one mating plate 34, the mating plate 34 is arranged on an upper surface of the support plate 123, and a second screw 6 passes through the mating plate 34 for a threaded connection to the support plate 123, to fasten the air baffle 3 onto the mounting bracket 12. For example, in examples of FIG. 5 to FIG. 7, the mounting bracket 12 is provided with the support plate 123. During mounting, the mating plate 34 on the air baffle 3 is vertically aligned with the support plate 123, and the second screw 6 passes through the mating plate 34 from up to down for a threaded connection to the support plate 123, thereby fastening the air baffle 3 onto the mounting bracket 12. During disassembly, only the second screw 6 needs to be disengaged from the support plate 123. In this way, the structure is also simple and allows for easy assembly/disassembly.

Further, as shown in FIG. 5 to FIG. 7, the mounting bracket 12 is provided with an extension plate 124 extending upward, the support plate 123 is connected at the top of the extension plate 124, a second nut 1231 is arranged on a lower surface of the support plate 123, and the second screw 6 passes through the mating plate 34 and the support plate 123 for a threaded connection to the second nut 1231. For example, in the examples of FIG. 5 to FIG. 7, the mounting bracket 12 is provided with the extension plate 124, and the extension plate 124 extends upward vertically. Two support plates 123 are respectively connected at the top of two extension plates 124. During mounting, the second screw 6 passes through the mating plate 34 and the support plate 123 from up to down for a threaded connection to the second nut 1231 at the lower surface of the support plate 123, to implement firm fastening of the air baffle 3. During disassembly, the second screw 6 is disengaged from the second nut 1231. Therefore, the arrangement of the second nut 1231 increases the thickness of the support plate 123, which ensures the structural strength of the support plate 123, and can implement firm fastening of the air baffle 3.

Further, with reference to FIG. 5 to FIG. 7, the extension plate 124 includes an extension plate body 1241 and a limiting plate 1242; and the air baffle 3 is provided with a notch 35, the support plate 123 is fitted at the notch 35, and edges of the notch 35 are fitted between the extension plate body 1241 and the limiting plate 1242. For example, in the examples of FIG. 5 to FIG. 7, the opening of the notch 35 faces the mounting bracket 12. During mounting, the mating plate 34 is in contact with the support plate 123 under the avoidance of the notch 35, and the edges of the notch 35 are located between the extension plate body 1241 and the limiting plate 1242. Therefore, fitting the edges of the notch 35 between the extension plate body 1241 and the limiting plate 1242 limits a left-right movement of the air baffle 3, thereby further ensuring the stability of the fastening of the air baffle 3.

A server (not shown in the figure) according to an embodiment in a second aspect of the present disclosure includes a PCB heat dissipation assembly 100 according to the embodiment in the first aspect of the present disclosure. For example, a fan is arranged on a side of the PCB heat dissipation assembly 100 of the server. When the fan is operating, a flow direction of heat dissipation airflow is shown by the arrow A in FIG. 1, FIG. 3, and FIG. 5. One part of the heat dissipation airflow flows through the heat dissipation air duct 21 of the heat sink 2 and then flows out of the server, to take away the heat conducted from the chips 11 to the heat sink 2. The other part of the heat dissipation airflow flows between the air baffle 3 and the heat sink 2, which can also implement heat dissipation from the chips 11. With such an arrangement, the air baffle 3 can play a good role in stopping the air sent out by the fan, thereby reducing the loss of heat dissipation air, improving the heat dissipation efficiency of the PCB heat dissipation assembly 100, and thus improving the overall performance of the server.

According to the server in this embodiment of the present disclosure, the use of the foregoing PCB heat dissipation assembly 100 makes the heat dissipation efficiency of the server higher, and can thus improve the overall performance of the server.

Other configurations and operations of the server according to the embodiments of the present disclosure are all known to those of ordinary skill in the art, and will not be described in detail herein.

In the description of the present disclosure, it should be understood that orientation or position relationships indicated by terms such as "center", "longitudinal", "transverse", "length", "width", "thickness", "up", "down", "front", "rear", "left", "right", "vertical", "horizontal", "top", "bottom", "inside", "outside", "axial", "radial", and "circumferential" are based on orientation or position relationships shown in the accompanying drawings and are merely for ease of description of the present disclosure and simplification of the description, rather than indicating or implying that the apparatuses or elements referred to must have a specific orientation or be constructed and operated in a specific orientation, and therefore cannot be construed as limiting the present disclosure.

In the description of the present disclosure, a "first feature" and a "second feature" may include one or more features.

In the description of this specification, the description with reference to terms such as "an embodiment", "some embodiments", "a schematic embodiment", "an example", "a specific example", or "some examples" means that specific features, structures, materials, or characteristics described in conjunction with the embodiments or examples are included in at least one embodiment or example of the present disclosure. In this specification, the schematic expressions of the above terms do not necessarily refer to the same embodiments or examples. Furthermore, the specific features, structures, materials, or characteristics described may be combined in a suitable manner in any one or more embodiments or examples.

Although the embodiments of the present disclosure have been shown and described, those of ordinary skill in the art can understand that various changes, modifications, substitutions and variations can be made to these embodiments without departing from the principles and spirit of the present disclosure. The scope of the present disclosure is defined by the claims and equivalents thereof

What is claimed is:

1. A PCB heat dissipation assembly, comprising:
   a PCB board, a plurality of chips being arranged on the PCB board;
   at least one heat sink, the heat sink being arranged on the plurality of chips, and the heat sink comprising a heat dissipation air duct; and
   an air baffle, the air baffle being arranged adjacent to the at least one heat sink, the air baffle being located on one side of the at least one heat sink, the air baffle extending along the heat dissipation air duct, and the air baffle being in a threaded connection to the PCB board;
   wherein at least one mounting bracket and at least one mounting bar are fastened onto the PCB board, the at least one mounting bracket and the at least one mounting bar are spaced apart in a lengthwise direction of the air baffle, the air baffle is in a threaded connection to the mounting bracket, the at least one mounting bar is opposite the bottom of the air baffle, and the at least one mounting bar is arranged between and presses against the air baffle and the PCB board.

2. The PCB heat dissipation assembly according to claim 1, wherein one end of the air baffle is provided with an air guide plate.

3. The PCB heat dissipation assembly according to claim 2, wherein a distance between the air guide plate and the heat sink gradually increases in a direction away from the air baffle.

4. The PCB heat dissipation assembly according to claim 2, wherein the air baffle and the air guide plate are both connected by welds to the PCB board.

5. The PCB heat dissipation assembly according to claim 4, wherein the bottom of the air baffle is provided with a first bent edge, the bottom of the air guide plate is provided with a second bent edge, the air baffle is connected by welds to the PCB board by means of the first bent edge, the air guide plate is connected by welds to the PCB board by means of the second bent edge, and the first bent edge and the second bent edge are spaced apart.

6. The PCB heat dissipation assembly according to claim 1, wherein the mounting bracket is provided with a connecting plate extending upward, a first nut is arranged on a side of the connecting plate that is away from the air baffle, and a first screw passes through the air baffle for a threaded connection to the first nut, to fasten the air baffle onto the mounting bracket.

7. The PCB heat dissipation assembly according to claim 6, wherein the air baffle is formed with a positioning hole, and the connecting plate is provided with a positioning portion fitted in the positioning hole.

8. The PCB heat dissipation assembly according to claim 6, wherein a spacer plate is arranged on a side of the air baffle that is away from the connecting plate, and the first screw passes through the spacer plate and the air baffle for a threaded connection to the first nut.

9. The PCB heat dissipation assembly according to claim 1, wherein the mounting bracket is provided with a horizontally extending support plate; and
   the air baffle is provided with at least one mating plate, the mating plate is arranged on an upper surface of the support plate, and a second screw passes through the mating plate for a threaded connection to the support plate, to fasten the air baffle onto the mounting bracket.

10. The PCB heat dissipation assembly according to claim 9, wherein the mounting bracket is provided with an extension plate extending upward, the support plate is connected at the top of the extension plate, a second nut is arranged on a lower surface of the support plate, and the second screw passes through the mating plate and the support plate for a threaded connection to the second nut.

11. The PCB heat dissipation assembly according to claim 10, wherein the extension plate comprises an extension plate body and a limiting plate; and
   the air baffle is provided with a notch, the support plate is fitted at the notch, and edges of the notch are fitted between the extension plate body and the limiting plate.

12. A server, comprising the PCB heat dissipation assembly according to claim 1.

* * * * *